(12) United States Patent
Su et al.

(10) Patent No.: US 11,248,617 B2
(45) Date of Patent: Feb. 15, 2022

(54) FAN CONTROL SYSTEM

(71) Applicants: SITRONIX TECHNOLOGY CORP., Zhubei (TW); INFINNO TECHNOLOGY CORP., Zhubei (TW)

(72) Inventors: Chung-Hsin Su, Zhubei (TW); Hui-Tsung Yang, Zhubei (TW); Feng-Jen Chang, Zhubei (TW)

(73) Assignee: Sitronix Technology Corp., Jhubei (TW)

( * ) Notice: Subject to any disclaimer, the term of this patent is extended or adjusted under 35 U.S.C. 154(b) by 0 days.

(21) Appl. No.: 16/522,003

(22) Filed: Jul. 25, 2019

(65) Prior Publication Data

US 2021/0071675 A1    Mar. 11, 2021

Related U.S. Application Data

(60) Provisional application No. 62/703,072, filed on Jul. 25, 2018.

(51) Int. Cl.
| | | |
|---|---|---|
| *F04D 27/00* | (2006.01) | |
| *F04D 15/00* | (2006.01) | |
| *F04D 19/00* | (2006.01) | |
| *F04D 25/06* | (2006.01) | |
| *H05K 7/20* | (2006.01) | |

(52) U.S. Cl.
CPC ....... *F04D 27/001* (2013.01); *F04D 15/0066* (2013.01); *F04D 15/0077* (2013.01); *F04D 19/002* (2013.01); *F04D 27/004* (2013.01); *F04D 27/008* (2013.01); *F04D 25/0693* (2013.01); *H05K 7/20209* (2013.01); *Y02B 30/70* (2013.01)

(58) Field of Classification Search
CPC .... F04D 27/004; F04D 27/001; F04D 19/002; F04D 15/0066; F04D 15/0077; F04D 27/00; Y02B 30/70; H05K 7/20209
See application file for complete search history.

(56) References Cited

U.S. PATENT DOCUMENTS

| | | | |
|---|---|---|---|
| 6,318,965 B1 * | 11/2001 | Nair | F04D 27/004 |
| | | | 417/2 |
| 6,597,972 B2 * | 7/2003 | Emberty | G05D 13/62 |
| | | | 700/304 |

(Continued)

FOREIGN PATENT DOCUMENTS

| | | |
|---|---|---|
| CN | 2472264 Y | 1/2002 |
| CN | 101399565 B | 1/2013 |

(Continued)

OTHER PUBLICATIONS

Foreign Patent Search Document Issued By a Foreign Patent Office (10920666530).

(Continued)

*Primary Examiner* — Peter J Bertheaud
(74) *Attorney, Agent, or Firm* — Rosenberg, Klein & Lee

(57) ABSTRACT

The present invention relates to a fan control system, which comprises a controller and a detection circuit. The controller controls a fan. The detection circuit detects at least one state of the fan control system, and generates a confirmation signal according to the at least one state. The confirmation signal represents the state of the fan control system.

17 Claims, 6 Drawing Sheets

(56) References Cited

U.S. PATENT DOCUMENTS

| | | | | |
|---|---|---|---|---|
| 7,711,439 B2* | 5/2010 | Frankel | ............. | H05K 7/20209 |
| | | | | 700/17 |
| 9,057,378 B2* | 6/2015 | Franz | ................... | F04D 27/008 |
| 9,223,325 B2* | 12/2015 | Hensley | .................. | G06F 1/206 |
| 9,512,851 B2* | 12/2016 | Suwa | .................... | F04D 19/002 |
| 10,257,959 B2* | 4/2019 | Warren | ............. | H05K 7/20172 |
| 2010/0076728 A1* | 3/2010 | Yanao | ................ | G05B 23/0237 |
| | | | | 702/183 |

FOREIGN PATENT DOCUMENTS

| | | | |
|---|---|---|---|
| CN | 103807199 A | | 5/2014 |
| CN | 103970640 A | | 8/2014 |
| CN | 104373366 A | | 2/2015 |
| CN | 104571273 A | | 4/2015 |
| CN | 104571414 A | | 4/2015 |
| TW | 201823989 A | | 7/2018 |

OTHER PUBLICATIONS

Chinese Patent Office Official Action dated Jul. 27, 2020 for corresponding CN Application No. 2019106779568.

* cited by examiner

FAN CONTROL SYSTEM

FIELD OF THE INVENTION

The present invention relates generally to a control system, and particularly to a fan control system.

BACKGROUND OF THE INVENTION

A general fan controller controls the turning of a fan according to loading when the power is supplied to the fan control system. For example, high loading is accompanied by high temperatures. Thereby, the fan controller controls the turning of a fan in high loading. Nonetheless, during the manufacturing process of fan control systems, when the power is just supplied to a fan control system or a fan control system is just booted, the fan controller will control the fan not to turn under the control rules according to loading. In other words, when the power is just supplied to the fan control system or the fan control system is just booted, the loading is low and the fan is controlled not to turn. Consequently, during the manufacturing process of fan control systems, it is not possible to know if the fan control system can operate normally to control fan.

Accordingly, the present invention provides a fan control system, which may let observer know immediately if the fan control system operates normally during the manufacturing process of the fan control system or when the fan control system is booted.

SUMMARY

An objective of the present invention is to provide a fan control system, which may let observer know immediately if the fan control system operates normally during the manufacturing process of the fan control system or when the fan control system is booted.

The present invention discloses a fan control system, which comprises a controller and a detection circuit. The controller controls a fan. The detection circuit detects at least one state of the fan control system, generates a confirmation signal according to the at least one state of the fan control system. The confirmation signal represents the state of the fan control system and if the fan control system operates normally.

DETAILED DESCRIPTION

In the specifications and subsequent claims, certain words are used for representing specific elements. A person having ordinary skill in the art should know that hardware manufacturers might use different nouns to call the same element. In the specifications and subsequent claims, the differences in names are not used for distinguishing elements. Instead, the differences on an element in the whole technique are the guidelines for distinguishing. In the whole specifications and subsequent claims, the word "comprising" is an open language and should be explained as "comprising but not limited to". Besides, the word "couple" includes any direct and indirect electrical connection. Thereby, if the description is that a first device is coupled to a second device, it means that the first device is connected to the second device directly, or the first device is connected to the second device via other device or connecting means indirectly.

Figure 1:
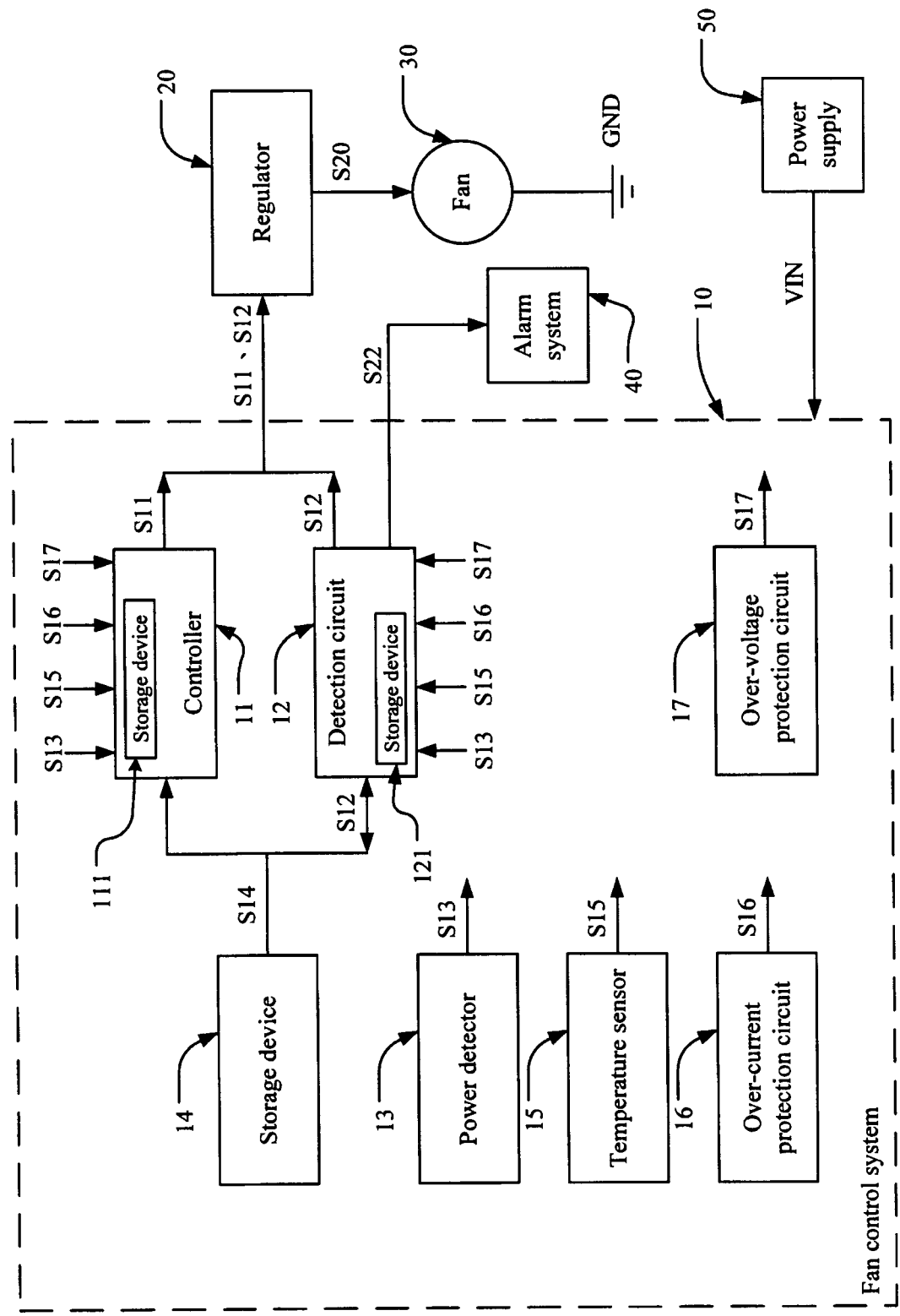
FIG. 1 shows a schematic diagram of the fan control system according to an embodiment of the present invention.

Please refer to FIG. 1, which shows a schematic diagram of the fan control system according to an embodiment of the present invention. As shown in the figure, a fan control system 10 is coupled to a regulator 20 and an alarm system 40. The regulator 20 is coupled to a fan 30. The fan 30 is coupled to a ground GND. Thereby, the fan control system 10 may control the turning speed of the fan 30 or the fan 30 not to turn. In FIG. 1, the fan control system 10 controls the turning speed of the fan 30 or the fan 30 not to turn via the regulator 20. The regulator 20 may selectively be disposed inside the fan control system 10 or integrated to the fan 30. In addition, according to the embodiment in FIG. 1, the regulator 20 may be excluded. That is to say, the fan control system 10 or the fan 30 does not include the regulator 20. Instead, the fan control system 10 generates a control signal S11 or a confirmation signal S12 to control the turning speed of the fan 30 directly. Besides, the control signal S11 and the confirmation signal S12 may be a pulse-width modulation (PWM) signal.

When the fan control system 10 is in a normal system state, it can control the turning speed of the fan 30. Contrarily, when the fan control system 10 is in an abnormal system state, it can control the fan 30 not to turn. Thereby, an observer may acquire one or more state of the fan control system 10. Alternatively, the fan control system 10 outputs an alarm signal S22 to an alarm system 40. Then the alarm system 40 displays one or more state of the fan control system 10 according to the alarm signal S22, so that the observer knows the one or more state of the fan control system 10. The observer may be an operator in production line or the automatic equipment in production testing.

The fan control system 10 is coupled to a power supply 50, which provides an input power source YIN to the fan control system 10. In addition, the power supply 50 may supply power sources to other devices, for example, the fan 20, a display, a motherboard, or other driving chips. Thereby, the power supply 50 may be disposed inside or outside the fan control system 10. The fan control system 10 may be a fan control chip. Alternatively, the fan control system 10 may be disposed inside a power control chip.

The fan control system 10 comprises a controller 11 and a detection circuit 12. During the startup process of the fan control system 10, the controller 11 may control the turning speed of the fan 30 or the fan 30 not to turn. Alternatively, the detection circuit 12 may control the turning speed of the fan 30 or the fan 30 not to turn. Likewise, the controller 11 and the detection circuit 12 may control the turning speed of the fan 30 or the fan 30 not to turn via the regulator 20. In a detection period of the detection circuit 12, where the detection period means the detection circuit 12 detects at least one state of the fan control system 10, such as the startup process of the fan control system 10, the control permission belongs to the detection circuit 12. After the detection circuit 12 completes detection, for example, the fan control system 10 finishes startup, the control permission of the fan 30 belongs to the controller 11. Thereby, the fan 30 is controlled by the controller 11 or the detection circuit 12.

The at least one state of the fan control system 10 may include the states of the input power source VIN provided by the power supply 50, for example, the power state of the input power source VIN, the voltage state or the current state, namely, the output power state, the voltage state, or the current state of the power supply 20. Besides, the at least one state of the fan control system 10 may further include the storage state of a storage device 14 or state of a temperature sensor 15 of the fan control system 10. Thereby, the detection circuit 12 is coupled to the controller 11. The detection circuit 12 detects the at least one state of the fan control system 10 as described above during the detection period, generates the confirmation signal S12 according to the at least one state of the fan control system 10, and outputs the confirmation signal S12 to the controller 11. The controller 11 controls the turning speed of the fan 30 or the fan 30 not to turn. Alternatively, the detection circuit 12 generates the confirmation signal S12, outputs the confirmation signal S12 to the regulator 20, and controls the turning speed of the fan 30 or the fan 30 not to turn. In other words, the confirmation signal S12 may represent the state of the fan control system 10.

The fan control system 10 may further comprise a power detector 13, the storage device 14, the temperature sensor 15, an over-current protection circuit 16, and an over-voltage protection circuit 17. The power detector 13 is coupled to the output terminal of the power supply 50 for detecting the power of the input power source VIN and generating a power detection signal S13 according to the power state of the input power source VIN. The power detector 13 is coupled to the detection circuit 12 for outputting the power detection signal S13 to the detection circuit 12. The detection circuit 12 knows the power state of the input power source VIN according to the power detection signal S13 and generates the confirmation signal S12. The power detection signal S13 may represent the power state of the input power source VIN to be normal or abnormal. The storage device 14 may be a memory, such as a nonvolatile memory, for storing the operating programs of the fan control system 10 or at least one control parameter of the fan control system 10. For example, the control parameter may be the curve for controlling the turning speed of a fan and may be a curve corresponding the turning speed of a fan to the temperature. The storage device 14 stores a storage state code. The detection circuit 12 is coupled to the storage device 14 for detecting the storage state code and generating the confirmation signal S12. The storage state code represents if the programs or the control parameters are stored to the storage device 14 correctly, representing the storage state of the programs or the control parameters. On the contrary, if the programs or the control parameters are not stored to the storage device 14 correctly, the storage state code stored in the storage device 14 will be the code representing storage error. Thereby, when the detection circuit 12 detects the storage state code of the storage device 14, if the code representing storage error is detected, it generates the confirmation signal S12 according to the code representing storage error. For example, the correct storage code may be A1 while the error storage code may be A2. The forms and values of the codes are not limited to the above examples.

The temperature sensor 15 may be, for example, a temperature sensing impedance element, which senses the temperature of the fan control system 10 for generating a temperature detection signal S15. The temperature detection signal S15 represents the temperature state of the fan control system 10. When the fan control system 10 operates normally, the controller 11 may know the temperature of the fan control system 10 according to the temperature detection signal S15 and control the turning speed of the fan 10. The detection circuit 12 of the fan control system 10 according to the present invention may sense the state of the temperature sensor 15 during the production process of the fan control system 10 or in each startup process of the fan control system 10 for detecting if the temperature sensor 15 is damaged. The temperature sensor 15 is coupled to the detection circuit 12 for outputting the temperature detection signal S15 to the detection circuit 12. When the temperature sensor 15 is open-circuited, the voltage level of the temperature detection signal S15 will rise abnormally. When the temperature sensor 15 is short-circuited, the voltage level of the temperature detection signal S15 will approach zero. Thereby, the detection circuit 12 may know the state of the temperature sensor 15 according to the temperature detection signal S15 and then generate the confirmation signal S12.

The over-current protection circuit 14 is coupled to the output terminal of the power supply 50 for detecting the current state of the input power source VIN of the power supply 50. The over-current protection circuit 16 generates a current state signal S16 according to the current state of the power supply 50. The over-current protection circuit 16 is coupled to the detection circuit 12 for outputting the current state signal S16 to the detection circuit 12. The detection circuit 12 then generates the confirmation signal S12 according to the current state signal S16. The over-voltage protection circuit 17 is coupled to the output terminal of the power supply 50 for detecting the voltage state of the input power source VIN of the power supply 50. The over-voltage protection circuit 17 generates a voltage state signal S17 according to the voltage state of the power supply 50. The over-voltage protection circuit 17 is coupled to the detection circuit 12 for outputting the voltage state signal S17 to the detection circuit 12. The detection circuit 12 then generates the confirmation signal S12 according to the voltage state signal S17.

The controller 11 and the detection circuit 12 may include at least one storage device 111 and at least one storage device 121, respectively. The storage devices 111, 121 of the controller 11 and the detection circuit 12 may be registers for storing the at least one state datum of the fan control system 10. The at least one state datum represents if the at least one state of the fan control system 10 is normal. The controller 11 and the detection circuit 12 may read the at least one state datum for controlling the turning speed of the fan 30 or the fan 30 not to turn according to the at least one state datum. Thereby, the at least one state datum may be related to the state of the input power source VIN, the storage state of the storage device 14, the state of the temperature sensor 15 of the fan control system 10. Accordingly, the controller 11 and the detection circuit 12 may read at least one register datum (at least one state datum) of the at least one register for controlling the turning speed of the fan 30, the fan 30 not to turn, or transmitting various alarm signals so that observer may know the states of the fan control system 10.

In addition to the storage devices 111, 121 of the controller 11 and the detection circuit 12, the at least one state datum of the fan control system 10 may also be stored in the storage devices (registers) in various circuits. Thereby, the power detector 13, the over-current protection circuit 16, and the over-voltage protection circuit 17 may, likewise, include at least one storage device, which may be registers as well. In other words, after the power detector 13, the over-current protection circuit 16, and the over-voltage protection circuit 17 detects the power supply 50, the power detection signal S13, the current state signal S16, and the voltage state signal S17 may be stored in their own registers. The controller 11 and the detection circuit 12 may read the state datum related to the power supply 50 stored in the registers of the power detector 13, the over-current protection circuit 16, and the over-voltage protection circuit 17, for example, the power detection signal S13, the current state signal S16, and the voltage state signal S17. The temperature sensor 15 may, likewise, includes at least one storage device for storing the temperature detection signal S15.

After the detection circuit 12 completes detecting, the controller 11 reads the control parameters stored in the storage device 14 and controls the turning speed and the turning time of the fan 30 according to the loading and the control parameters. In addition, after the detection circuit 12 completes detecting, the power detector 13, the temperature sensor 15, the over-current protection circuit 16, and the over-voltage protection circuit 17 continues to detect the states of the fan control system 10 and the power supply 50 for outputting the power detection signal S13, the temperature detection signal S15, the current state signal S16, and the voltage state signal S17 to the controller 11. The controller 11 receives the power detection signal S13, the temperature detection signal S15, the current state signal S16, and the voltage state signal S17 and generates the alarm signal to the alarm system 40, so that the user may know that the state of the fan control system 10 is the normal system state or the abnormal system state, and the state of the power supply 50 is the normal power state or the abnormal power state.

Figure 2:
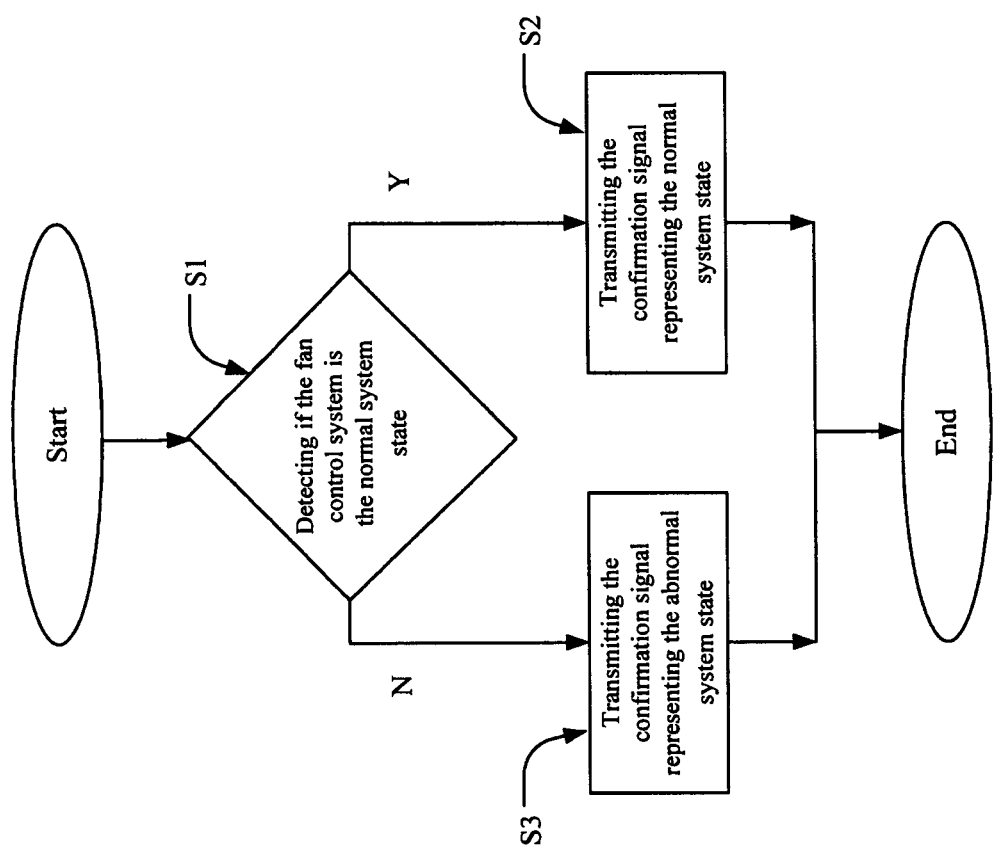
FIG. 2 shows a flowchart of detection operation of the detection circuit according to an embodiment of the present invention.

Please refer to FIG. 2, which shows a flowchart of detection operation of the detection circuit according to an embodiment of the present invention. As shown in the figure, in the step S1, the detection circuit 12 detects if the state of the fan control system 10 is normal system state. According to the embodiment in FIG. 1, it means to detect if the state of the input power source VIN, the storage state of the storage device 14, and the state of the temperature sensor 15 are normal. If so, in the step S2, the detection circuit 12 transmits the confirmation signal S12 representing the normal system state. Contrarily, if one of the above states is abnormal, in the step S3, the detection circuit 12 transmits the confirmation signal S12 representing the abnormal system state. Furthermore, after the detection circuit 12 generates the confirmation signal S12, please refer to FIG. 3, which shows a schematic diagram of the fan control system controlling the fan according to a first embodiment of the present invention. As shown in the figure, the detection circuit 12 outputs the confirmation signal S12 to the controller 11. The controller 11 receives the confirmation signal S12 and generates the control signal S11 according to the confirmation signal S12 for controlling the turning of the fan 30 or not to turn. Alternatively, the controller 11 is coupled to the regulator 20, and outputs the control signal S11 to the regulator 20 according to the confirmation signal S12. Then the regulator 20 generates a control voltage S20 according to the control signal S11 and a supply voltage P1. The fan 30 determines the turning speed according to the control voltage S20. The supply voltage P1 may be supplied by the input power source VIN.

Figure 3:
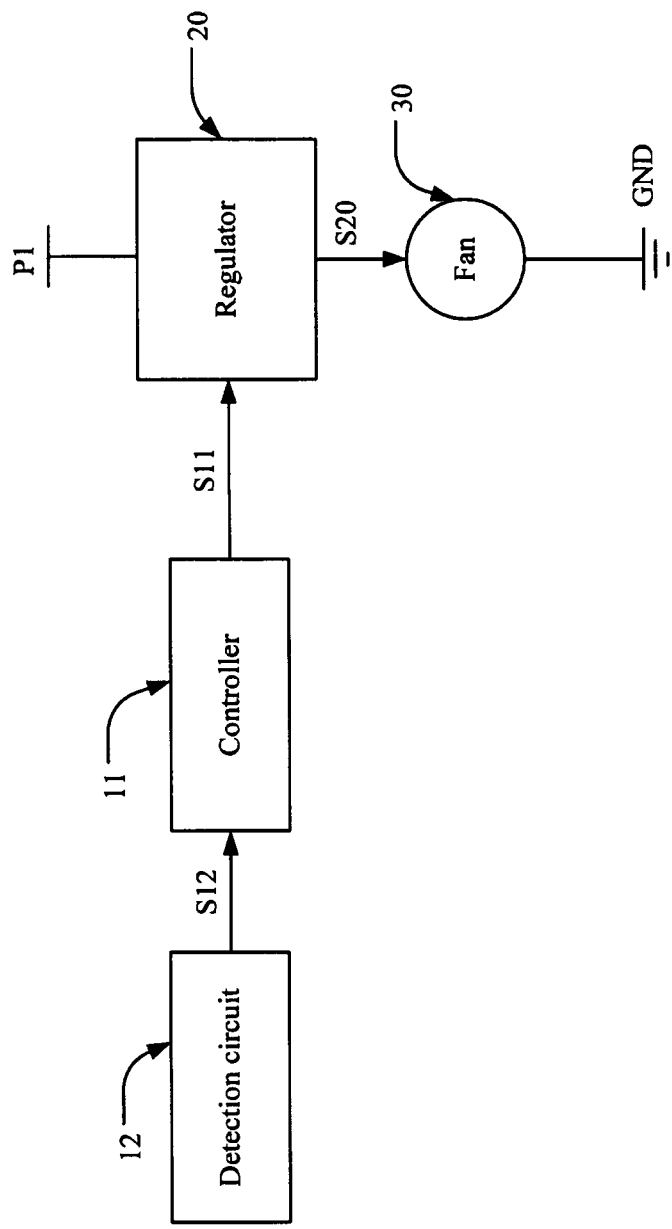
FIG. 3 shows a schematic diagram of the fan control system controlling the fan according to a first embodiment of the present invention.
Figure 4:
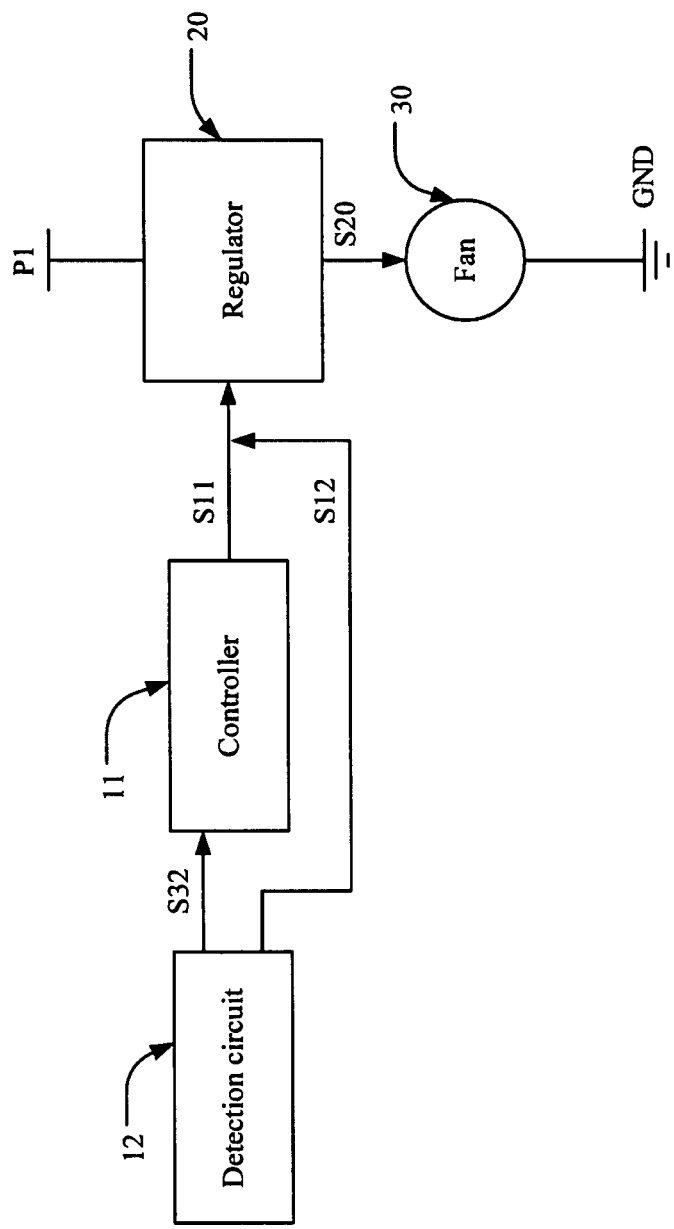
FIG. 4 shows a schematic diagram of the fan control system controlling the fan according to a second embodiment of the present invention.

Please refer to FIG. 4, which shows a schematic diagram of the fan control system controlling the fan according to a second embodiment of the present invention. As shown in the figure, the detection circuit 12 is coupled to the regulator 20. After the detection circuit 12 generates the confirmation signal S12, it outputs the confirmation signal S12 to the regulator 20, the regulator 20 controls the turning speed of the fan 30 according to the confirmation signal S12. In addition, when the control permission of the fan 30 belongs to the detection circuit 12, the detection circuit 12 generates a disable signal S32 to the controller 11 for disabling the controller 11 from controlling the fan 30. On the contrary, as the embodiment in FIG. 3, when the control permission of the fan 30 belongs to the controller 11, the detection circuit 12 needs not to generate the disable signal S32 to the controller 11.

Figure 5:
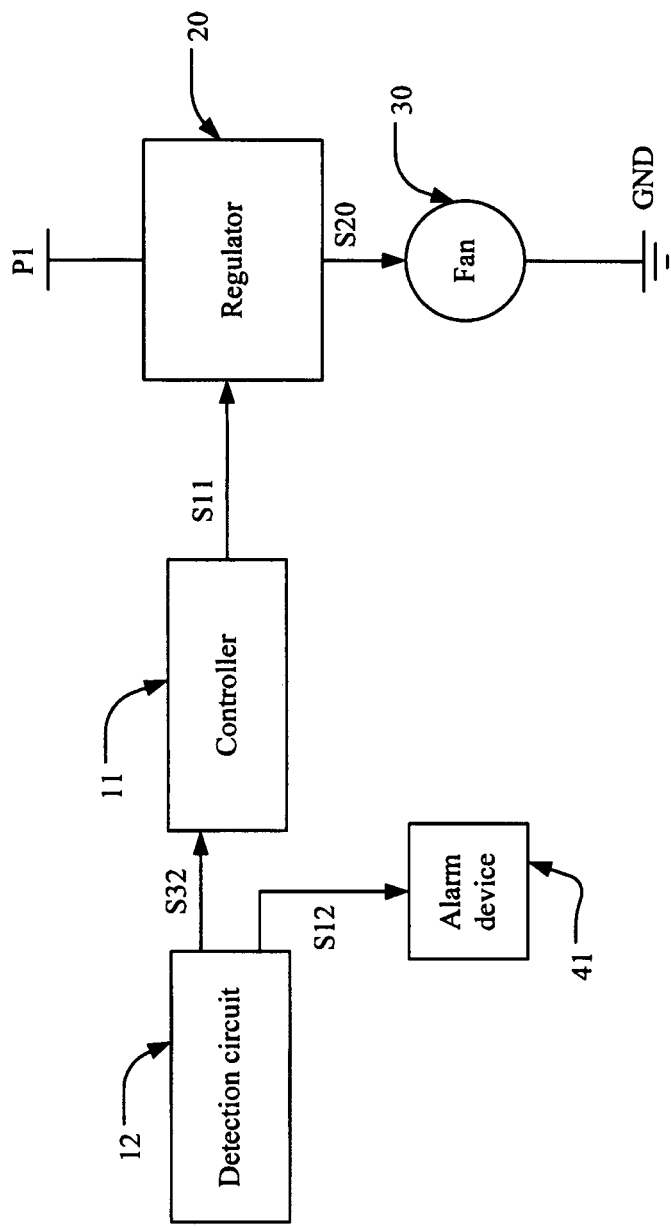
FIG. 5 shows a schematic diagram of the fan control system controlling the fan not to turn according to an embodiment of the present invention.

Please refer to FIG. 5, which shows a schematic diagram of the fan control system controlling the fan not to turn according to an embodiment of the present invention. As shown in the figure, when the detection circuit 12 detects that the state of the fan control system 10 is abnormal system state, it outputs the confirmation signal S12 representing the abnormal system state to an alarm device 41 for alarming the state of the fan control system 10 to be abnormal system state. The alarm device 41 may be disposed inside the alarm system 40 and controlled by the alarm system 40. Alternatively, as shown in the embodiment of FIG. 5, the alarm device 41 may alarm the observer according to the confirmation signal S12 representing the abnormal system state. At this moment, since the state of the fan control system 10 is abnormal system state, the detection circuit 12 outputs the disable signal S32 to the controller 11 for disabling the operation of the controller 11. If the operation of the controller 11 is not disabled, the fan control system 10 might be damaged.

Moreover, according to the control method of the embodiment in FIG. 4, when the state of the fan control system 10 is abnormal system state, the detection circuit 12 may control the fan 30 not to turn according to the confirmation signal S12 representing the abnormal system state. In addition, the detection circuit 12 may likewise output the confirmation signal S12 representing the abnormal system state to the regulator 20. Then the regulator 20 controls the fan 30 not to turn according to the confirmation signal S12 representing the abnormal system state.

Besides, as shown in FIG. 3, when the state of the fan control system 10 is abnormal system state and the control permission of the fan 30 belongs to the controller 11, the detection circuit 12 outputs the confirmation signal S12 representing the abnormal system state to the controller 11. The controller 11 controls the fan 30 not to turn according to the confirmation signal S12 representing the abnormal system state. In addition, the controller 11 may likewise outputs the control signal S11 to the regulator 20 according to the confirmation signal S12 representing the abnormal system state. The regulator 20 then controls the fan 30 not to turn according to the control signal S11.

Figure 6:
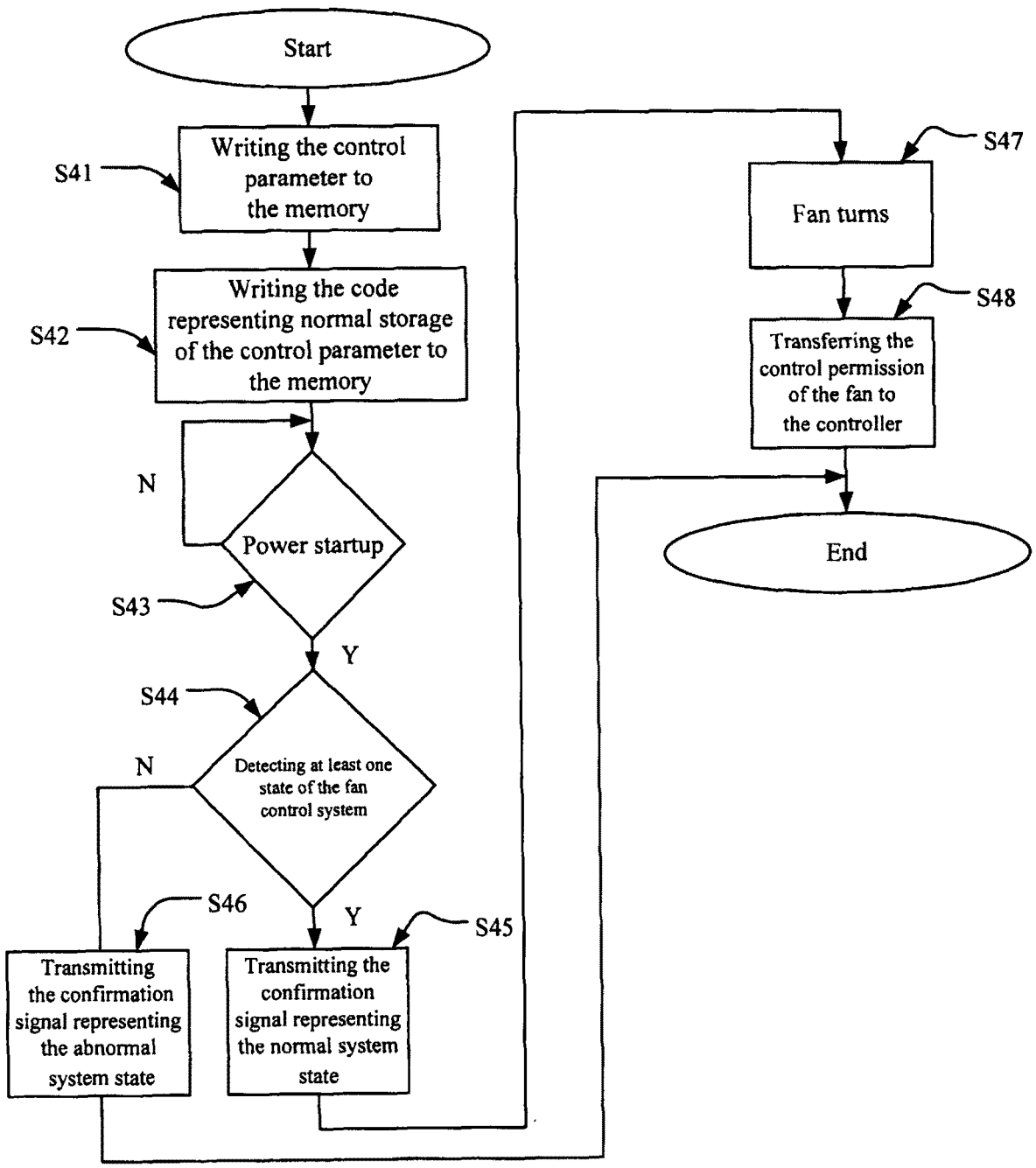
FIG. 6 shows a flowchart of manufacturing the fan control system according to an embodiment of the present invention.

Please refer to FIG. 6, which shows a flowchart of manufacturing the fan control system according to an embodiment of the present invention. As shown in the figure, in the step S41, the operator in production line writes the control parameters to the storage device 14 (the memory). In the step S42, the operator in production line or the inspection system examines if the control parameters are written to the storage device 14 correctly. If so, write the code representing normal storage of the control parameters (for example, A1) to the storage device 14. The above steps S41 and S42 may include storing programs to the storage device 14 and confirming if the programs are written to the storage device 14 correctly. In the step S43, the power supply 50 is started up and starts to supply power to the fan control system 10. In the step S44, after the power supply 50 is started up, the detection circuit 12 detects the at least one state of the fan control system 10. As described above, the at least one state of the fan control system 10 may include the state of the input power source VIN, the storage state of the storage device 14, the state of the temperature sensor 15, and other states not listed in the embodiments.

When the state of the fan control system 10 is normal system state, in the step S45, the detection circuit 12 transmits the confirmation signal S12 representing the normal system state; when the state of the fan control system 10 is abnormal system state, in the step S46, the detection circuit 12 transmits the confirmation signal S12 representing the abnormal system state. As described above, when the state of the fan control system 10 is normal system state, in the step S47, the detection circuit 12 transmits the confirmation signal S12 representing the normal system state for controlling the fan 30 to turn. Afterwards, in the step S48, the detection circuit 12 does not output the disable signal S32 and transfers the control permission of the fan 30 to the controller 11. In addition, when the state of the fan control system 10 is abnormal system state, the detection circuit 12 controls the fan 30 not to turn and then ends detection. According to the above description, in addition to inspecting if the fan control system 10 is normal during the production process, the fan control system 10 may perform self-inspection when it starts to operate so that the user may know if the fan control system 10 can operate normally.

To sum up, the present invention relates to a fan control system, which comprises a controller and a detection circuit. The controller controls a fan. The detection circuit detects at least one state of the fan control system, generates a confirmation signal according to the at least one state of the fan control system. The confirmation signal represents the state of the fan control system.

However, the foregoing description is only embodiments of the present invention, not used to limit the scope and range of the present invention. Those equivalent changes or modifications made according to the circuit, structure, feature, or spirit described in the claims of the present invention are included in the appended claims of the present invention.

The invention claimed is:
1. A fan control system, comprising:
a controller, controlling a fan; and
a detection circuit, detecting one or more state of said fan control system, generating a confirmation signal according to said one or more state of said fan control system, and said confirmation signal representing said state of said fan control system;
wherein said one or more state of said fan control system includes a power state of an input power source, said detection circuit generating said confirmation signal according to said power state of said input power source in a startup process of said fan control system, said fan is controlled according to said confirmation signal.
2. The fan control system of claim 1, comprising one or more storage device, storing one or more piece of state datum, said one or more state datum representing said one or more state of said fan control system, and said detection circuit reading said one or more state datum for generating said confirmation signal.
3. The fan control system of claim 1, further comprising:
a power detector, detecting said input power source for generating a power detecting signal, and said power detection signal representing the power state of said input power source.
4. The fan control system of claim 1, and further comprising:
a temperature sensor, sensing the temperature of said fan control system for generating a temperature detection signal;
where said one or more state of said fan control system includes the state of said temperature sensor, and said detection circuit generates said confirmation signal according to said temperature detection signal.
5. The fan control system of claim 1, wherein said one or more state of said fan control system includes a current state of a power supply, and further comprising:
an over-current protection circuit, detecting said current state of said power supply for generating a current state signal, and said detection circuit generating said confirmation signal according to said current state signal.
6. The fan control system of claim 1, wherein said one or more state of said fan control system includes a voltage state of a power supply, and further comprising:
an over-voltage protection circuit, detecting said voltage state of said power supply for generating a voltage state signal, and said detection circuit generating said confirmation signal according to said voltage state signal.
7. The fan control system of claim 1, wherein said controller receives said confirmation signal and controls the fan to turn according to said confirmation signal.
8. The fan control system of claim 7, wherein said controller is coupled to a regulator; said controller outputs a control signal to said regulator according to said confirmation signal; and said regulator controls said fan to turn according to said control signal.
9. The fan control system of claim 1, wherein said one or more state of said fan control system includes a storage state of a control parameter; said detection circuit is coupled to a storage device; said storage device stores a storage state code; said detection circuit detects said storage state code for generating said confirmation signal; and said storage state code represents if said control parameter is stored to said storage device correctly.
10. The fan control system of claim 1, wherein said detection circuit outputs said confirmation signal to said fan for controlling said fan to turn.
11. The fan control system of claim 1, wherein said detection circuit is coupled to a regulator and outputs said confirmation signal to said regulator; and said regulator controls said fan to turn according to said confirmation signal.
12. The fan control system of claim 1, wherein when said detection circuit detects said state of said fan control system is an abnormal system state, said detection circuit generates said confirmation signal representing said abnormal system state.
13. The fan control system of claim 12, wherein said detection circuit controls said fan not to turn according to said confirmation signal representing said abnormal system state.
14. The fan control system of claim 13, wherein said detection circuit outputs said confirmation signal representing said abnormal system state to a regulator, and said regulator controls said fan not to turn according to said confirmation signal representing said abnormal system state.

15. The fan control system of claim 12, wherein said detection circuit outputs said confirmation signal representing said abnormal system state to said controller, and said controller controls said fan not to turn according to said confirmation signal representing said abnormal system state.

16. The fan control system of claim 15, wherein said controller outputs a control signal to a regulator according to said confirmation signal representing said abnormal system state, and said regulator controls said fan not to turn according to said control signal.

17. The fan control system of claim 12, wherein said detection circuit outputs said confirmation signal representing said abnormal system state to an alarm device, and said alarm device alarms that said state of said fan control system is said abnormal system state.

* * * * *